(12) United States Patent
Amano et al.

(10) Patent No.: US 8,895,873 B2
(45) Date of Patent: Nov. 25, 2014

(54) PRINTED WIRING BOARD

(75) Inventors: Tetsuo Amano, Ogaki (JP); Toshio Nishiwaki, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 93 days.

(21) Appl. No.: 13/535,532

(22) Filed: Jun. 28, 2012

(65) Prior Publication Data

US 2013/0075147 A1    Mar. 28, 2013

Related U.S. Application Data

(60) Provisional application No. 61/540,235, filed on Sep. 28, 2011.

(51) Int. Cl.
  *H05K 3/46* (2006.01)
  *H05K 1/02* (2006.01)
  *H05K 3/42* (2006.01)

(52) U.S. Cl.
  CPC ............ *H05K 3/4655* (2013.01); *H05K 1/0219* (2013.01); *H05K 1/024* (2013.01); *H05K 3/427* (2013.01); *H05K 3/4602* (2013.01); *H05K 2201/096* (2013.01)
  USPC ........................................................ 174/264

(58) Field of Classification Search
  None
  See application file for complete search history.

(56) References Cited

U.S. PATENT DOCUMENTS

| 6,509,528 | B1 * | 1/2003 | Mori et al. ................... 174/255 |
| 7,286,367 | B2 * | 10/2007 | Miyake et al. ................ 361/765 |
| 7,504,719 | B2 * | 3/2009 | En et al. ........................ 257/700 |
| 7,999,194 | B2 * | 8/2011 | Kawasaki et al. ............. 174/264 |
| 8,021,748 | B2 * | 9/2011 | Asai et al. ..................... 428/323 |
| 2010/0101838 | A1 * | 4/2010 | Inagaki et al. ................ 174/255 |
| 2011/0149532 | A1 * | 6/2011 | Takahashi ..................... 361/748 |

FOREIGN PATENT DOCUMENTS

JP    2004-231781    8/2004

* cited by examiner

*Primary Examiner* — Timothy Thompson
*Assistant Examiner* — Krystal Robinson
(74) *Attorney, Agent, or Firm* — Oblon, Spivak, McClelland, Maier & Neustadt, L.L.P.

(57) ABSTRACT

A printed wiring board includes a core insulation layer including a resin and having a via conductor through the core insulation layer, a first conductive layer formed on the core layer and including a copper foil and a plated film, an interlayer insulation layer formed on the first layer and including a resin, the interlayer layer having a via conductor through the interlayer layer, and a second conductive layer formed on the interlayer layer and including a copper foil and a plated film. The first layer includes a conductive circuit, the core and interlayer layers have dielectric constants of 4.0 or lower for signal transmission at frequency of 1 GHz and thermal expansion coefficient of 85 ppm/° C. or lower at or below Tg, and the foil of the first layer has thickness greater than thickness of the foil of the second layer.

20 Claims, 13 Drawing Sheets (A)

(B)

(C)

(A)

(B)

(A)

(B)

(A)

(B)

PRINTED WIRING BOARD

CROSS-REFERENCE TO RELATED APPLICATIONS

The present application is based on and claims the benefit of priority to U.S. Application No. 61/540,235, filed Sep. 28, 2011, the entire contents of which are incorporated herein by reference.

BACKGROUND OF THE INVENTION

1. Field of the Invention

The present invention relates to a printed wiring board made by laminating multiple interlayer insulation layers on both surfaces of a core insulation layer.

2. Discussion of the Background

In recent years, LSIs have been operated at high frequencies to respond to transmission/reception of broadband electrical signals. In Japanese Laid-Open Patent Publication No. 2004-231781, a wiring board is described in which a curable polyphenylene ether resin composition is used. The contents of this publication are incorporated herein by reference in their entirety.

SUMMARY OF THE INVENTION

According to one aspect of the present invention, a printed wiring board includes a core insulation layer including a resin and having a via conductor including a plating material filling a hole formed through the core insulation layer, a first conductive layer formed on a surface of the core insulation layer and including a copper foil laminated on the surface of the core insulation layer and a plated film formed on the copper foil, an interlayer insulation layer formed on the first conductive layer and including a resin, the interlayer insulation layer having a via conductor including a plating material filling a hole formed through the interlayer insulation layer, and a second conductive layer formed on the interlayer insulation layer and including a copper foil laminated on the interlayer insulation layer and a plated film formed on the copper foil of the second conductive layer. The first conductive layer includes a conductive circuit, the second conductive layer has a conductive circuit connected to the conductive circuit in the first conductive layer through the via conductor in the interlayer insulation layer, each of the core insulation layer and the interlayer insulation layer has a dielectric constant of 4.0 or lower for a signal transmission at a frequency of 1 GHz and a thermal expansion coefficient of 85 ppm/° C. or lower at or below Tg, and the copper foil of the first conductive layer has a thickness which is set greater than a thickness of the copper foil of the second conductive layer.

According to another aspect of the present invention, a printed wiring board includes a core insulation layer including a resin and having a via conductor including a plating material filling a hole formed through the core insulation layer, a first laminated structure formed on a first surface of the core insulation layer and including a first conductive layer, an interlayer insulation layer and a second conductive layer, and a second laminated structure formed on a second surface of the core insulation layer on the opposite side of the first surface of the core insulation layer and including a first conductive layer, an interlayer insulation layer and a second conductive layer. The first conductive layer of the first laminated structure is formed on the first surface of the core insulation layer and includes a copper foil laminated on the first surface of the core insulation layer and a plated film formed on the copper foil, the interlayer insulation layer of the first laminated structure is formed on the first conductive layer of the first laminated structure, includes a resin and has a via conductor including a plating material filling a hole formed through the interlayer insulation layer of the first laminated structure, the second conductive layer of the first laminated structure is formed on the interlayer insulation layer of the first laminated structure and includes a copper foil laminated on the interlayer insulation layer of the first laminated structure and a plated film formed on the copper foil of the second conductive layer of the first laminated structure, the first conductive layer of the second laminated structure is formed on the second surface of the core insulation layer and includes a copper foil laminated on the second surface of the core insulation layer and a plated film formed on the copper foil of the first conductive layer of the second laminated structure, the interlayer insulation layer of the second laminated structure is formed on the first conductive layer of the second laminated structure, includes a resin and has a via conductor including a plating material filling a hole formed through the interlayer insulation layer of the second laminated structure, the second conductive layer of the second structure is formed on the interlayer insulation layer of the second laminated structure and includes a copper foil laminated on the interlayer insulation layer of the second laminated structure and a plated film formed on the copper foil of the second conductive layer of the second laminated structure, each of the first conductive layers of the first and second laminated structures includes a conductive circuit, each of the second conductive layers of the first and second laminated structures has a conductive circuit connected to the conductive circuit in a respective one of the first conductive layers of the first and second laminated structures through the via conductor in a respective one of the interlayer insulation layers of the first and second laminated structures, each of the core insulation layer and the interlayer insulation layers has a dielectric constant of 4.0 or lower for a signal transmission at a frequency of 1 GHz and a thermal expansion coefficient of 85 ppm/° C. or lower at or below Tg, and the copper foil of the first conductive layer in each of the first and second laminated structures has a thickness which is set greater than a thickness of the copper foil of the second conductive layer in each of the first and second laminated structures.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
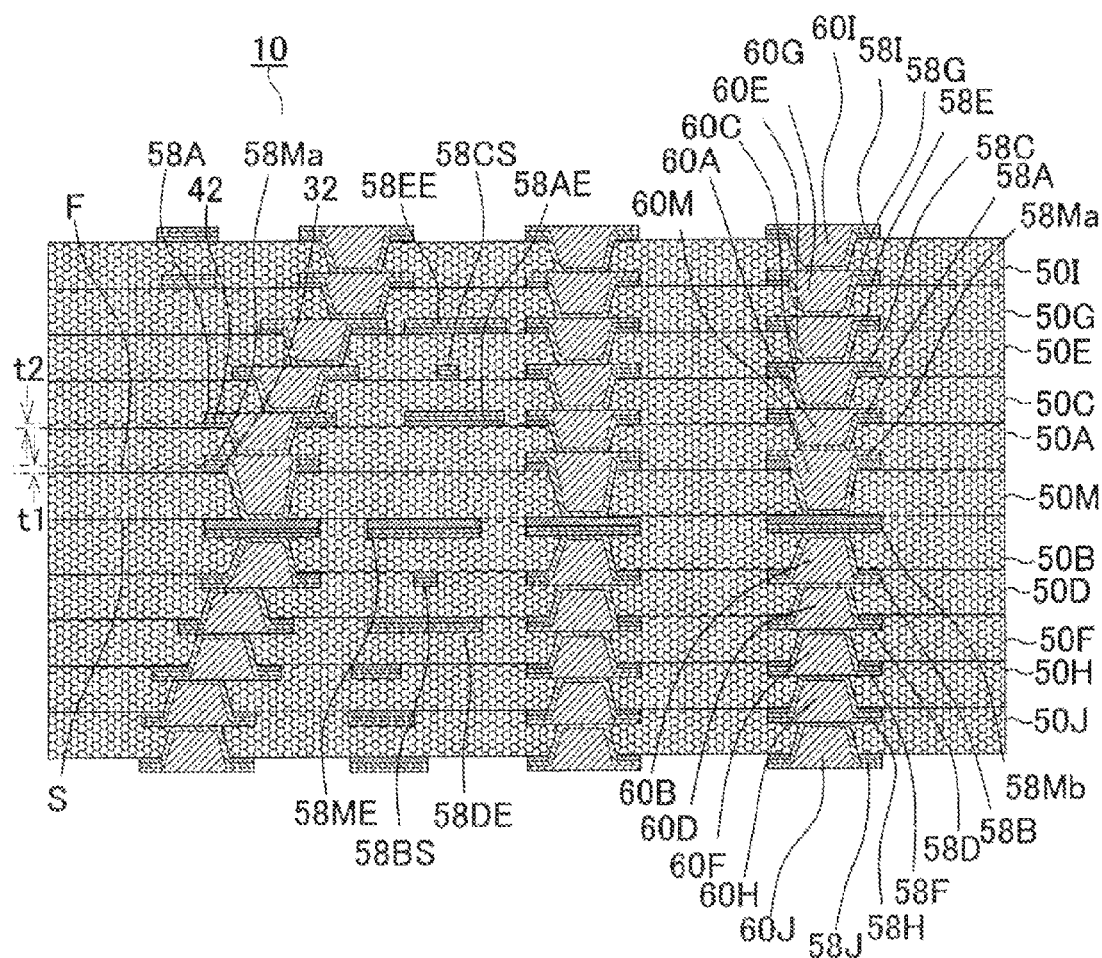
FIG. 1 is a cross-sectional view of a printed wiring board according to a first embodiment of the present invention.
Figure 2:
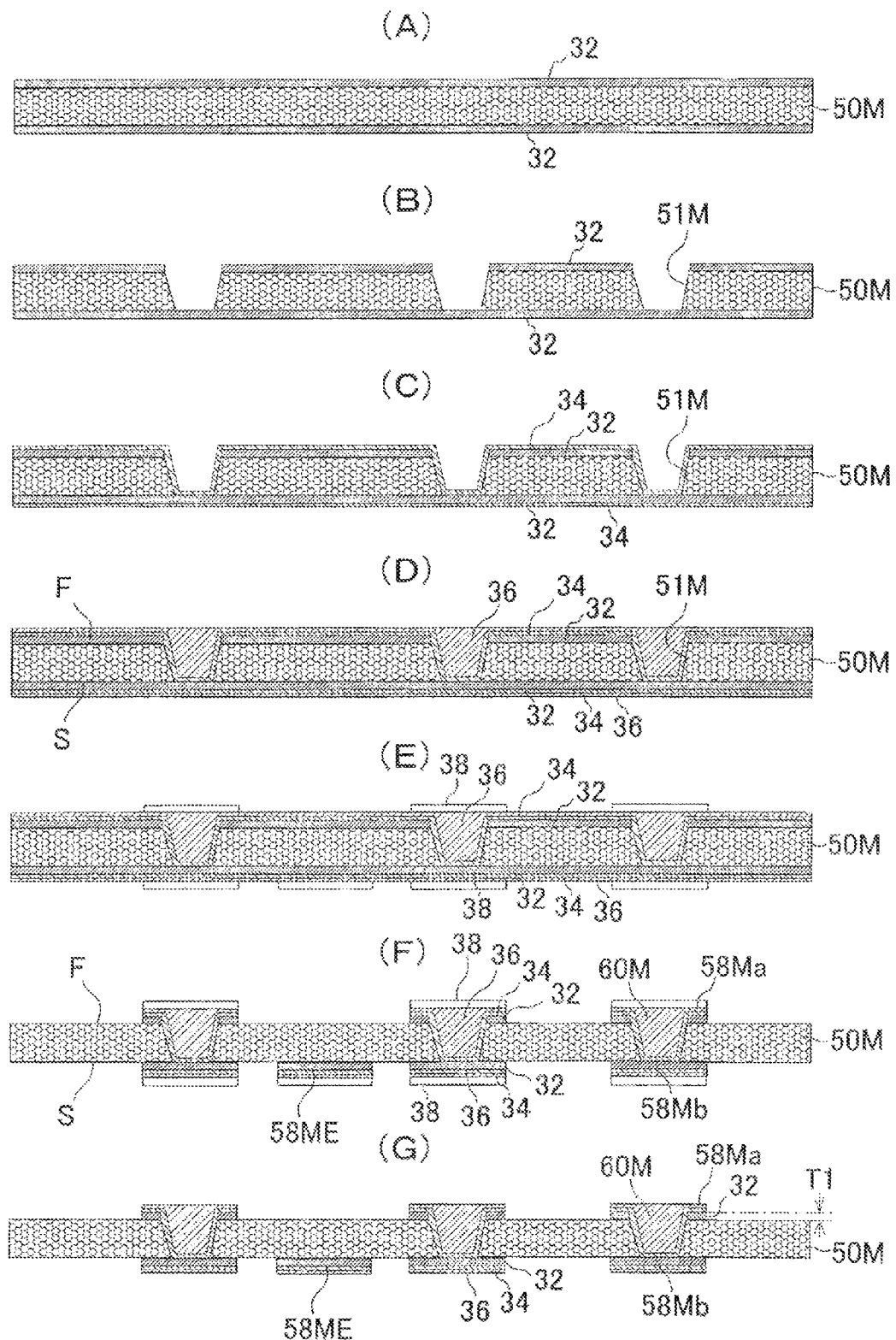
FIGS. 2(A)-2(G) are views showing manufacturing steps of a printed wiring board according to the first embodiment.
Figure 3:
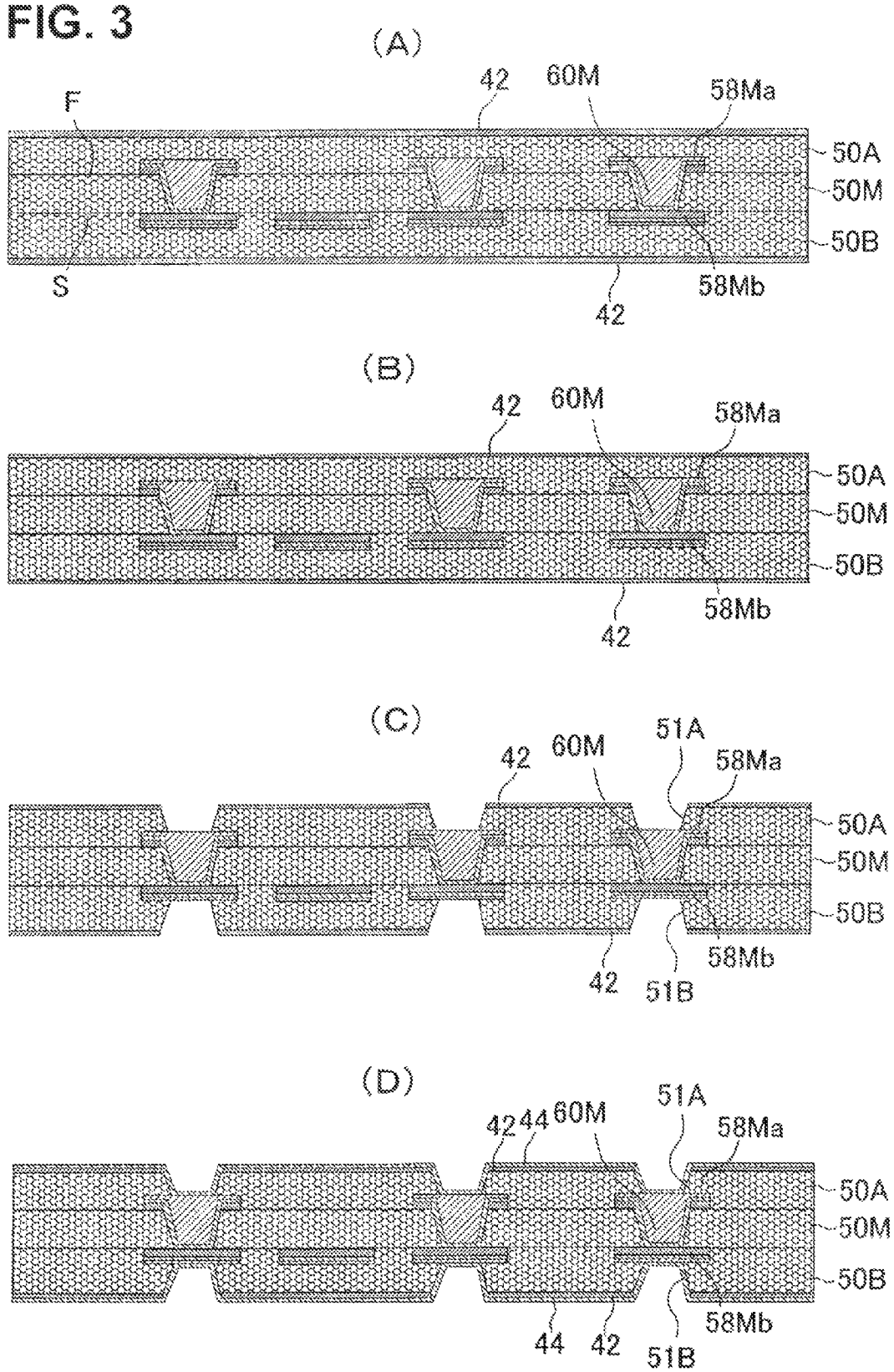
FIGS. 3(A)-3(D) are views showing manufacturing steps of a printed wiring board according to the first embodiment.
Figure 4:
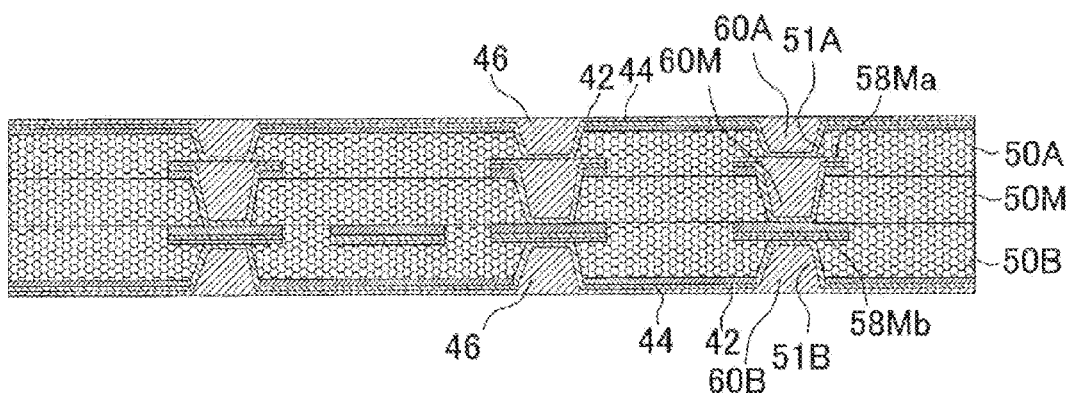
FIGS. 4(A)-4(C) are views showing manufacturing steps of a printed wiring board according to the first embodiment.
Figure 4:
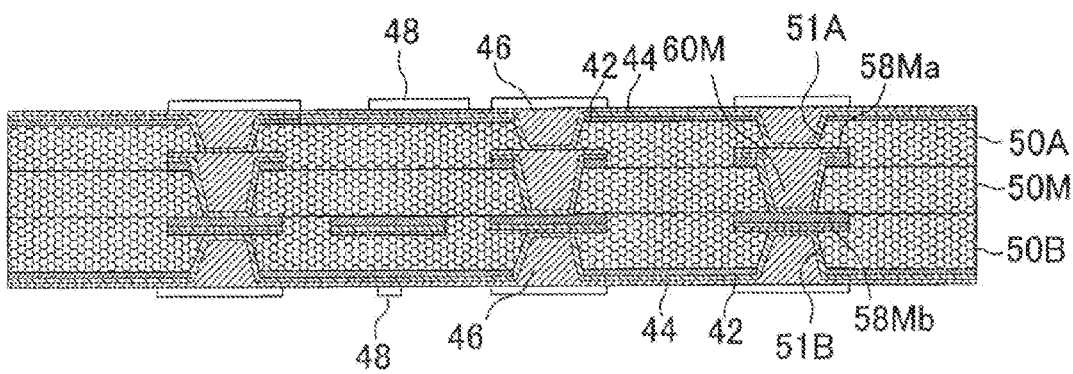
Figure 4:
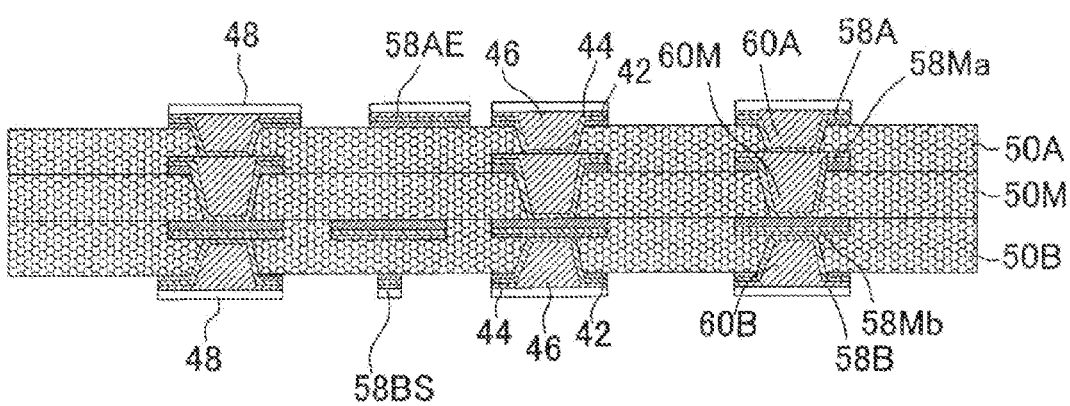
Figure 5:
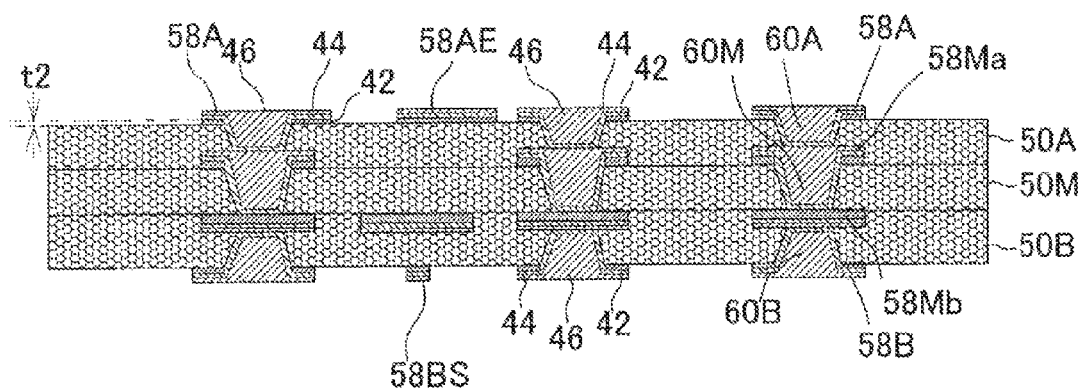
FIGS. 5(A)-5(B) are views showing manufacturing steps of a printed wiring board according to the first embodiment.
Figure 5:
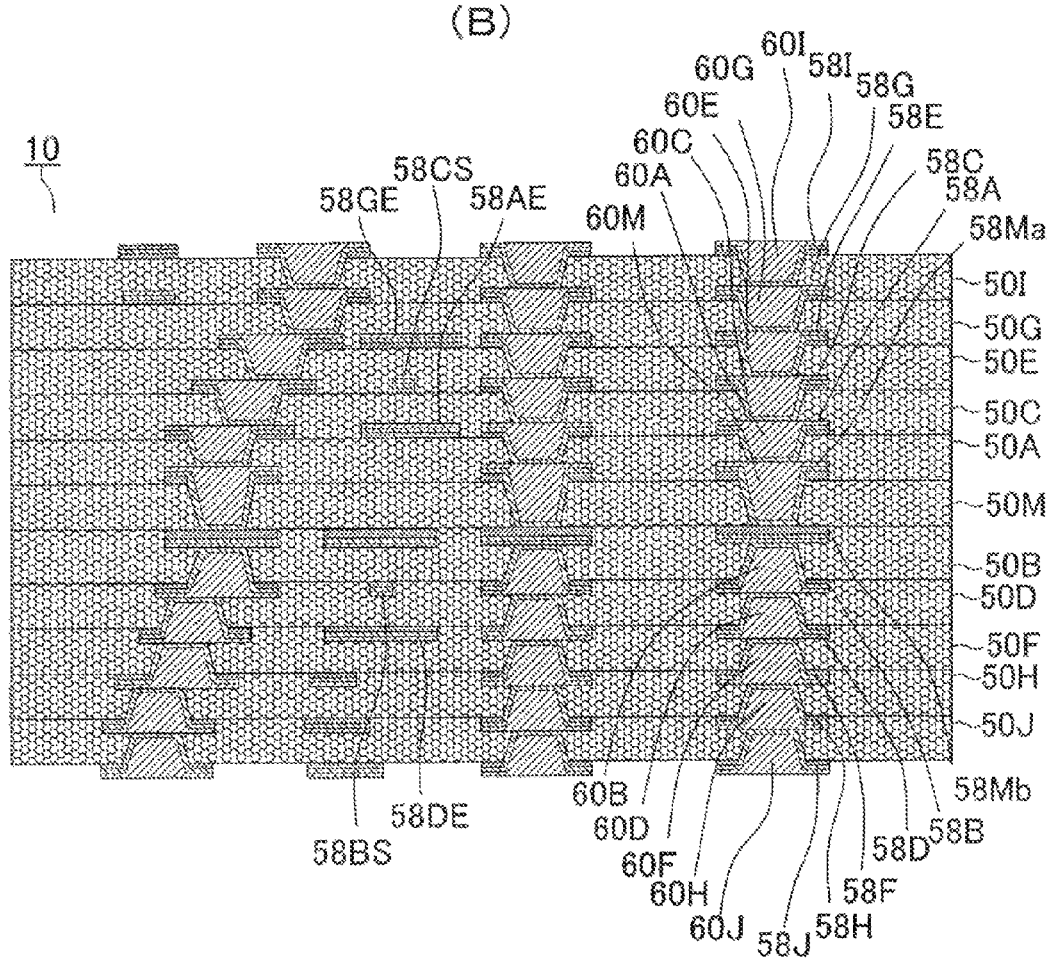
Figure 6:
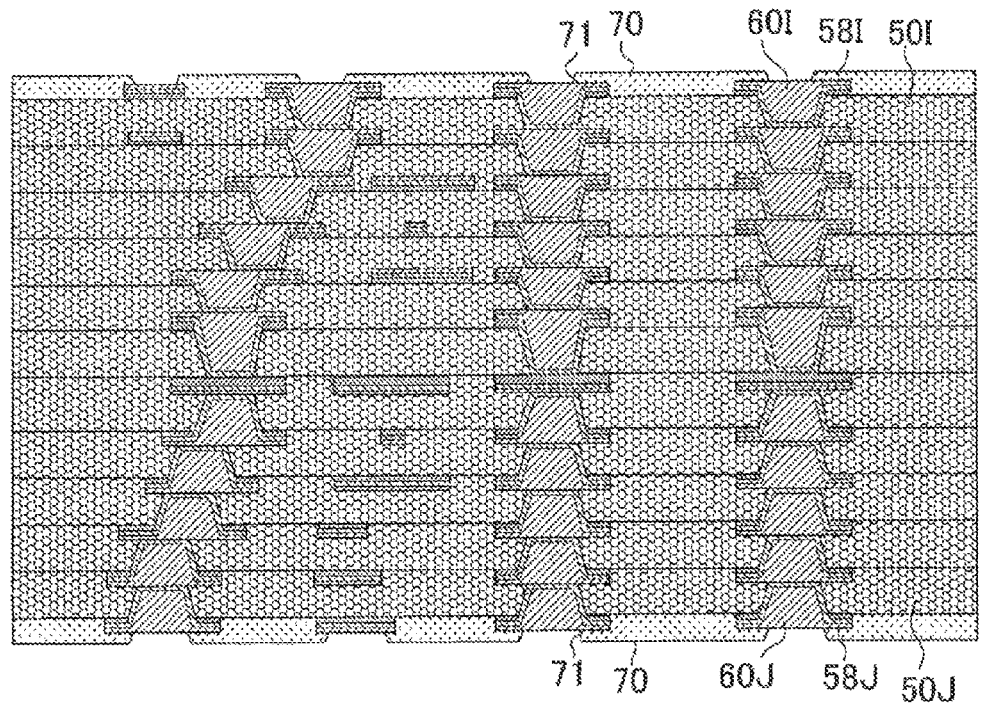
FIGS. 6(A)-6(B) are views showing manufacturing steps of a printed wiring board according to the first embodiment.
Figure 6:
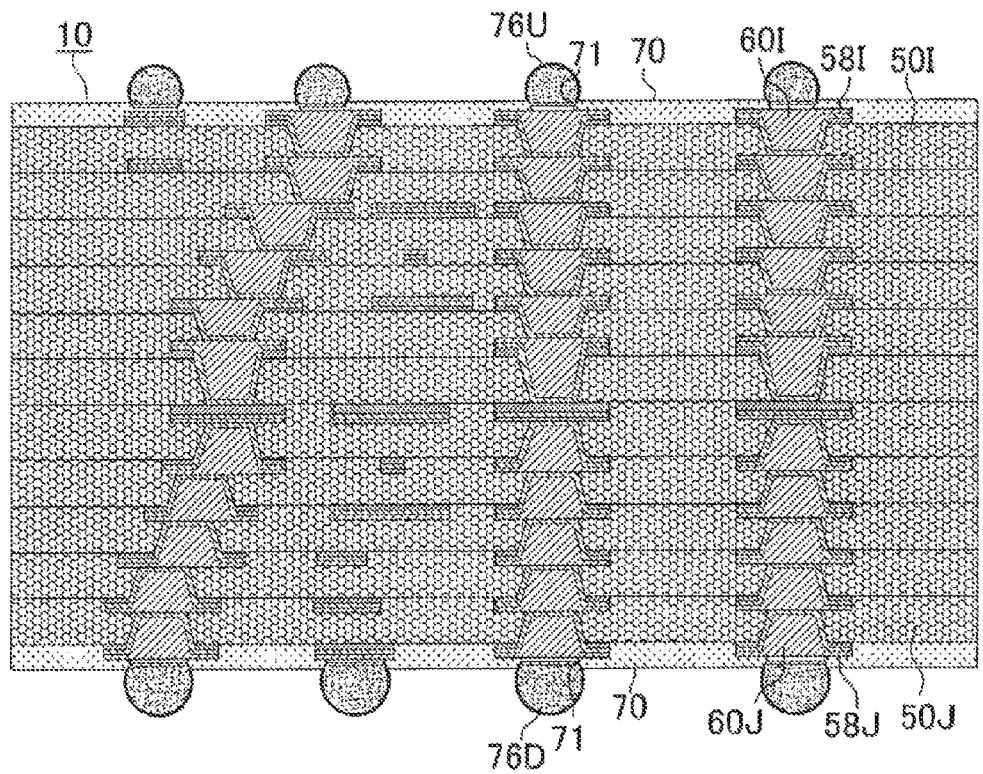

The embodiments will now be described with reference to the accompanying drawings, wherein like reference numerals designate corresponding or identical elements throughout the various drawings.

First Embodiment

FIG. 1 is a cross-sectional view of a printed wiring board according to a first embodiment. FIGS. 2~5 show manufacturing steps of such a printed wiring board.

In printed wiring board 10, interlayer insulation layers (50A, 50C, 50E, 50G, 50I) are laminated on the first-surface (F) side of core insulation layer (50M) positioned in the center, and interlayer insulation layers (50B, 50D, 50F, 50H, 50J) are laminated on the second-surface (S) side. Conductive circuit (58Ma) on first surface (F) of core insulation layer (50M) and conductive circuit (58Mb) on second surface (S) are connected by via conductor (60M). Via conductor (60M) is formed by filling copper plating in opening 51 formed in the core insulation layer (see FIG. 2(D)). Conductive circuit (58Ma) on first surface (F) is made of copper foil 32 on the core insulation layer, electroless plated film 34 and electrolytic plated film 36 (see FIG. 2(G)). Conductive circuit (58Mb) on the second-surface (S) side is made of copper foil 32 on the core insulation layer, electroless plated film 34 and electrolytic plated film 36 (see FIG. 2(G)). On the second-surface (S) side of core insulation layer (50M), ground layer (58ME) is further formed to structure a stripline. Conductive circuit (58A) on interlayer insulation layer (50A) is made of copper foil 42 on the interlayer insulation layer, electroless plated film 44 and electrolytic plated film 46 (see FIG. 5(A)). Here, thickness (t1) of copper foil 32 of conductive circuit (58Ma) on the core insulation layer shown in FIG. 2(G) is set at 8 μm, and thickness (t2) of copper foil 42 of conductive circuit (58A) shown in FIG. 5(A) is set at 4 μm.

In interlayer insulation layer (50A) laminated on the first-surface (F) side of core insulation layer (50M), via conductor (60A) is formed to connect conductive circuit (58A) on interlayer insulation layer (50A) to conductive circuit (58Ma) on core insulation layer (50M). In interlayer insulation layer (50C) laminated on interlayer insulation layer (50A), via conductor (60C) is formed to connect conductive circuit (58C) on interlayer insulation layer (50C) to conductive circuit (58A) on interlayer insulation layer (50A). In interlayer insulation layer (50E) laminated on interlayer insulation layer (50C), via conductor (60E) is formed to connect conductive circuit (58E) on interlayer insulation layer (50E) to conductive circuit (58C) on interlayer insulation layer (50C). In interlayer insulation layer (50G) laminated on interlayer insulation layer (50E), via conductor (60G) is formed to connect conductive circuit (58G) on interlayer insulation layer (50G) to conductive circuit (58E) on interlayer insulation layer (50E). In interlayer insulation layer (50I) laminated on interlayer insulation layer (50G), via conductor (60I) is formed to connect conductive circuit (58I) on interlayer insulation layer (50I) to conductive circuit (58G) on interlayer insulation layer (50G).

In interlayer insulation layer (50B) laminated on the second-surface (S) side of core insulation layer (50M), via conductor (60B) is formed to connect conductive circuit (58B) on interlayer insulation layer (50B) to conductive circuit (58Mb) on core insulation layer (50M). In interlayer insulation layer (50D) laminated on interlayer insulation layer (50B), via conductor (60D) is formed to connect conductive circuit (58D) on interlayer insulation layer (50D) to conductive circuit (58B) on interlayer insulation layer (50B). In interlayer insulation layer (50F) laminated on interlayer insulation layer (50D), via conductor (60F) is formed to connect conductive circuit (58F) on interlayer insulation layer (50F) to conductive circuit (58D) on interlayer insulation layer (50D). In interlayer insulation layer (50H) laminated on interlayer insulation layer (50F), via conductor (60H) is formed to connect conductive circuit (58H) on interlayer insulation layer (50H) to conductive circuit (58F) on interlayer insulation layer (50F). In interlayer insulation layer (50J) laminated on interlayer insulation layer (50H), via conductor (60J) is formed to connect conductive circuit (58J) on interlayer insulation layer (50J) to conductive circuit (58H) on interlayer insulation layer (50H).

As described above, ground layer (58ME) is formed on the second-surface side of core insulation layer (50M). Also, ground layer (58DE) is formed on second-surface side interlayer insulation layer (50D). Both ground layers (58ME, 58DE) structure a stripline for signal line (58BS) positioned on interlayer insulation layer (50B). In the same manner, ground layer (58AE) is formed on first-surface side interlayer insulation layer (50A). Also, ground layer (58EE) is formed on first-surface side interlayer insulation layer (50E). Both ground layers (58AE, 58EE) structure a stripline for signal line (58CS) positioned on interlayer insulation layer (50C).

In a printed wiring board of the first embodiment, core insulation layer (50M) and interlayer insulation layers (50A~50J) are each made of thermosetting polyphenylene ether resin, and are each set to have a dielectric constant of 4.0 or lower at 1GHz, and a thermal expansion coefficient of 85 ppm/° C. or lower at or below Tg (glass transition temperature), more preferably 55 ppm/° C. or lower. As described above, thickness (t1) of copper foil 32 of conductive circuit (58Ma) on the core insulation layer is 8 μm, and thickness (t2) of copper foil 42 of conductive circuit (58A) is 4 μm.

The printed wiring board according to the first embodiment is formed by laminating multiple interlayer insulation layers (50A~50J) on both surfaces of core insulation layer (50M). Since the core insulation layer and the interlayer insulation layers have a dielectric constant of 4.0 or lower at 1 GHz, required impedance characteristics are obtained without employing skip layers using multiple interlayer insulation layers when a stripline structure is formed, or without reducing wiring thickness to such a degree that would decrease production yield. On the other hand, the core insulation layer and the interlayer insulation layers with a low dielectric constant have high thermal expansion coefficients in direction Z, and thus stress from the interlayer insulation layers concentrates on the core insulation layer positioned in the center. Therefore, thickness (t1) of copper foil 32 of conductive circuits (58Ma, 58Mb) on both surfaces of the core insulation layer is set greater than thickness (t2) of copper foil 42 of the conductive circuits on the interlayer insulation layers to enhance rigidity. Accordingly, when stress is exerted, via conductors (60M) in the core insulation layer are prevented from being separated from copper foil 42, and the connection reliability of the via conductors is secured.

In the printed wiring board of the first embodiment, the thickness of copper foil 32 of conductive circuits (58Ma, 58Mb) on core insulation layer (50M) is set at 5 μm or greater. Therefore, separation of via conductors (60M) is prevented when stress is exerted, and the connection reliability of the via conductors is secured. In the printed wiring board of the first embodiment, via conductors (60I, 60G, 60E, 60C, 60A) in first-surface side interlayer insulation layers (50I, 50G, 50E, 50C, 50A), via conductor (60M) in core insulation layer (50M), and via conductors (60B, 60D, 60F, 60H, 60J) in second-surface side interlayer insulation layers (50B, 50D, 50F, 50H, 50J) are stacked. Therefore, stress from the via conductors in interlayer insulation layers (50I, 50G, 50E, 50C, 50A, 50B, 50D, 50F, 50H, 50J) concentrates on via conductor (60M) in the core insulation layer positioned in the center. Accordingly, copper foil 32 of conductive circuits (58Ma, 58Mb) on both surfaces of the core insulation layer is set thicker so that separation of via conductors (60M) of the core insulation layer is prevented when stress is exerted and connection reliability of the via conductors is secured.

In the printed wiring board of the first embodiment, a stripline is structured using a first conductive layer on the core insulation layer and/or a second conductive layer. Since the core insulation layer and the interlayer insulation layers each have a dielectric constant of 4.0 or lower at 1 GHz, required impedance characteristics are obtained without employing skip layers using multiple interlayer insulation layers.

In the printed wiring board of the first embodiment, since the core insulation layer and the interlayer insulation layers contain polyphenylene ether or its dielectric, their dielectric constant at 1 GHz can be set at 4.0 or lower, and transmission delay and transmission loss of electrical signals are reduced.

In the printed wiring board of the first embodiment, the thermal expansion coefficient of the core insulation layer and the interlayer insulation layers can be set at 55 ppm/° C. or lower since they contain inorganic filler.

In the first embodiment, a first-surface side interlayer insulation layer and a second-surface side interlayer insulation layer, which are at the same tiers counted from the core insulation layer, are made of the same material. Namely, interlayer insulation layer (50A) and interlayer insulation layer (50B) are made of the same material; interlayer insulation layer (50C) and interlayer insulation layer (50D) are made of the same material; interlayer insulation layer (50E) and interlayer insulation layer (50F) are made of the same material; interlayer insulation layer (50G) and interlayer insulation layer (50H) are made of the same material; and interlayer insulation layer (50I) and interlayer insulation layer (50J) are made of the same material. Accordingly, thermal stress generated on the upper and lower portions of a printed wiring board is symmetrical, and warping is prevented.

A method for manufacturing a printed wiring board of the first embodiment is shown in FIGS. 2~6.

(1) A double-sided copper-clad laminate is a starting material, where 8 μm-thick copper foils 32 are laminated on both surfaces of 0.15 mm-thick core insulation layer (50M) formed by impregnating glass-cloth core material with thermosetting polyphenylene ether resin. First, black-oxide treatment is conducted on surfaces of copper foils 32 (FIG. 2(A)).

Here, the thickness of copper foils 32 may be adjusted to be 8 μm by laminating 12 μm-thick copper foils and light etching the foils.

(2) A CO2 laser is irradiated at the first-surface (F) side of core insulation layer (50M) from first-surface (F) toward second surface (S) to form opening portions (51M) reaching second-surface side copper foil 32 (FIG. 2(B)).

(3) After desmearing is conducted on openings (51M) using permanganic acid, electroless plating is performed to form electroless plated film 34 (FIG. 2(C)), and electrolytic plated film 36 is further formed. Accordingly, via conductors (60M) made by filling plating in opening portions (51M) are formed (FIG. 2(D)).

(4) Etching resists 38 with predetermined patterns are formed on electrolytic plated films 36 on surfaces of core insulation layer (50M) (FIG. 2(E)).

(5) From portions where no etching resist is formed, electrolytic plated film 36, electroless plated film 34 and copper foil 32 on the first-surface side are removed, and electrolytic plated film 36, electroless plated film 34 and copper foil 32 on the second-surface side are removed (FIG. 2(F)). Then, the etching resists are removed so that core insulation layer (50M) having conductive circuits (58Ma, 58Mb) and via conductors (60M) is completed (FIG. 2(G)).

(6) Interlayer insulation layer (50A) made by impregnating glass-cloth core material with thermosetting polyphenylene ether resin and 8 μm-thick copper foil 42 are laminated on the first-surface (F) side of core insulation layer (50M); and interlayer insulation layer (50B) made by impregnating glass-cloth core material with thermosetting polyphenylene ether resin and 8 μm-thick copper foil 42 are laminated on the second-surface (S) side (FIG. 3(A)).

(7) The thickness of copper foils 42 is adjusted to be 4 μm through light etching (FIG. 3(B)), and a black-oxide treatment is conducted on the copper foils.

(8) By irradiating a CO2 laser, opening portions (51A) reaching conductive circuits (58Ma) are formed in interlayer insulation layer (50A), and opening portions (51B) reaching conductive circuits (58Mb) are formed in interlayer insulation layer (50B) (FIG. 3(C)).

(9) After a desmearing treatment is conducted on openings (51A, 51B), electroless plating is performed to form electroless plated film 44 (FIG. 3(D)), and electrolytic plated film 46 is further formed. Accordingly, via conductors (60A, 60B) made by filling plating in opening portions (51A, 51B) are formed (FIG. 4(A)).

(10) Etching resists 48 with predetermined patterns are formed on electrolytic plated films 36 on surfaces of interlayer insulation layers (50A, 50B) (FIG. 4(B)).

(11) Electrolytic plated film 46, electroless plated film 44 and copper foil 42 are removed from the portions where no etching resist is formed (FIG. 4(C)), and the etching resists are removed. Accordingly, interlayer insulation layer (50A) having conductive circuits (58A) and via conductors (60A) as well as interlayer insulation layer (50B) having conductive circuits (58B) and via conductors (60B) is completed (FIG. 5(A)).

(12) Treatments shown in FIGS. 3~5(A) are repeated so that interlayer insulation layer (50C) having conductive circuits (58C) and via conductors (60C) as well as interlayer insulation layer (50D) having conductive circuits (58D) and via conductors (60D) is laminated; and interlayer insulation layer (50E) having conductive circuits (58E) and via conductors (60E) as well as interlayer insulation layer (50F) having conductive circuits (58F) and via conductors (60F) is laminated. Furthermore, interlayer insulation layer (50G) having conductive circuits (58G) and via conductors (60G) as well as interlayer insulation layer (50H) having conductive circuits (58H) and via conductors (60H) is laminated; and interlayer insulation layer (50I) having conductive circuits (58I) and via conductors (60I) as well as interlayer insulation layer (50J) having conductive circuits (58J) and via conductors (60J) is laminated. Accordingly, printed wiring board 10 is completed (FIG. 5(B)).

(13) A commercially available solder-resist composition is applied, exposed to light and developed. Accordingly, solder-resist layers 70 having opening portions 71 are formed (FIG. 6(A)).

(14) A 5 μm-thick nickel-plated layer is formed in opening portions 71, and a 0.03 μm-thick gold-plated layer is formed on the nickel-plated layer (not shown in the drawings).

(15) Solder balls are loaded on first-surface side opening portions 71 and second-surface side opening portions 71 followed by a reflow process. Accordingly, solder bumps (76U) are formed on the first-surface (upper-surface) side, and solder bumps (76D) are formed on the second-surface (lower-surface) side. Printed wiring board 10 is completed (FIG. 6(B)).

First Modified Example of the First Embodiment

Figure 7:
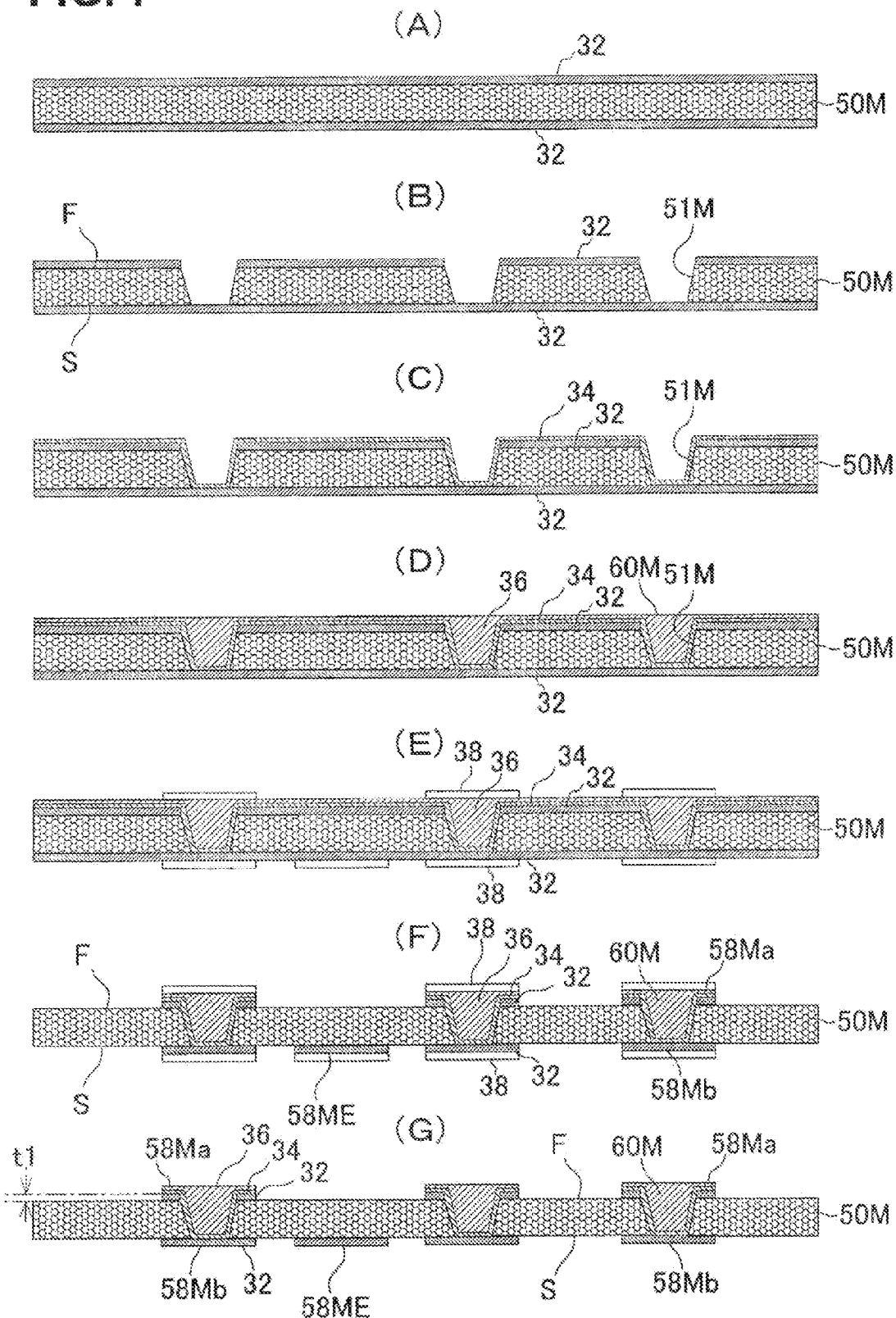
FIGS. 7(A)-7(G) are views showing manufacturing steps of a printed wiring board according to a first modified example of the first embodiment.

FIG. 7 shows a method for manufacturing a printed wiring board according to a modified example of the first embodiment. In the modified example of the first embodiment, electroless plated film 34 and electrolytic plated film 36 are not formed on second-surface (S) side copper foil 32 (FIGS. 7(C), 7(D)). After etching resists 38 are formed (FIG. 7(E)), electrolytic plated film 36, electroless plated film 34 and copper foil 32 on the first-surface side are removed from the portions where no etching resist is formed. Then, second-surface side copper foil 32 is removed (FIG. 7(F)), and the etching resists are removed (FIG. 7(G)). Since the subsequent steps are the same as in the first embodiment, their descriptions are omitted here.

Second Modified Example of the First Embodiment

Figure 8:
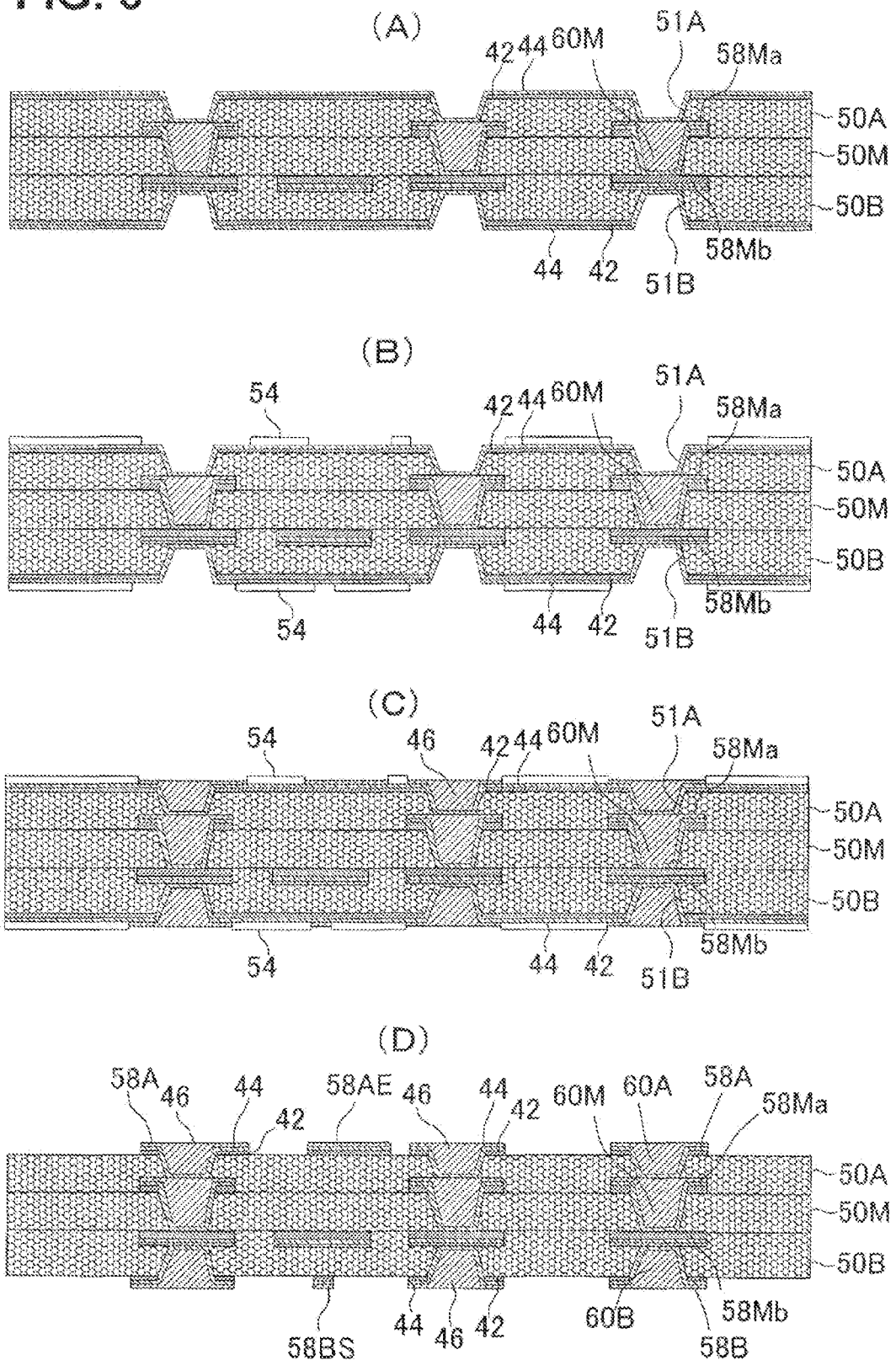
FIGS. 8(A)-8(D) are views showing manufacturing steps of a printed wiring board according to a second modified example of the first embodiment.

FIG. 8 shows a method for manufacturing a printed wiring board according to a second modified example of the first embodiment. In the second modified example of the first embodiment, conductive circuits are formed by a semi-additive method. Following the step described above with reference to FIG. 3(D) in the first embodiment (FIG. 8(A)), plating resists 54 with predetermined patterns are formed on the electroless plated films (FIG. 8(B)). Electrolytic plated films 46 are formed where no plating resist is formed (FIG. 8(C)). After the plating resists are removed, the electroless plated film and copper foil under the plating resists are removed, and via conductors (60A, 60B) and conductive circuits (58A, 58B) are completed (FIG. 8(D)).

Third Modified Example of the First Embodiment

Figure 9:
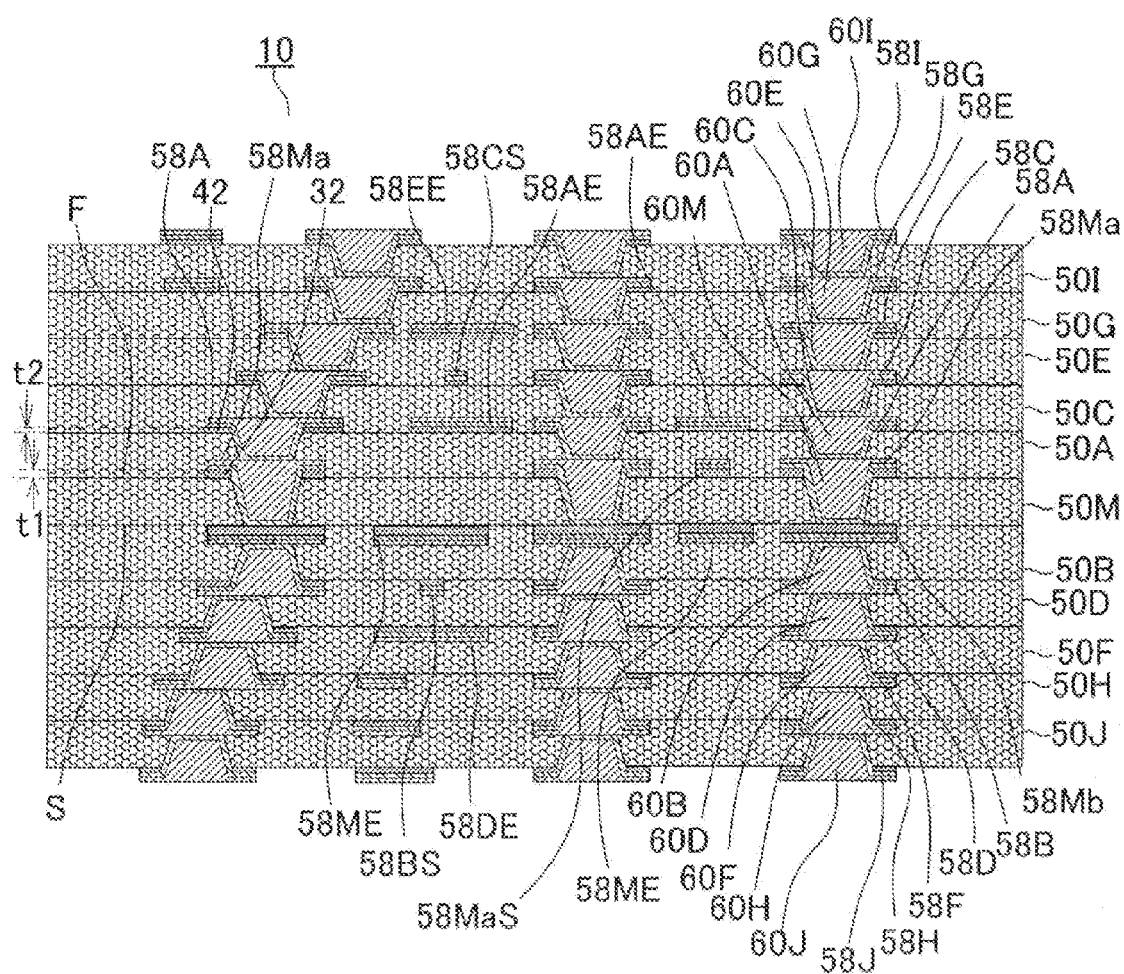
FIG. 9 is a cross-sectional view of a printed wiring board according to a third modified example of the first embodiment.

FIG. 9 shows a cross-sectional view of a printed wiring board according to a third modified example of the first embodiment. In the third modified example, signal line (58MaS) is positioned on the first-surface (F) side of core insulation layer (50M), and a stripline is structured by ground layer (58AE) on interlayer insulation layer (50A) and ground layer (58ME) on the second-surface (S) side of core insulation layer (50M).

Second Embodiment

Figure 10:
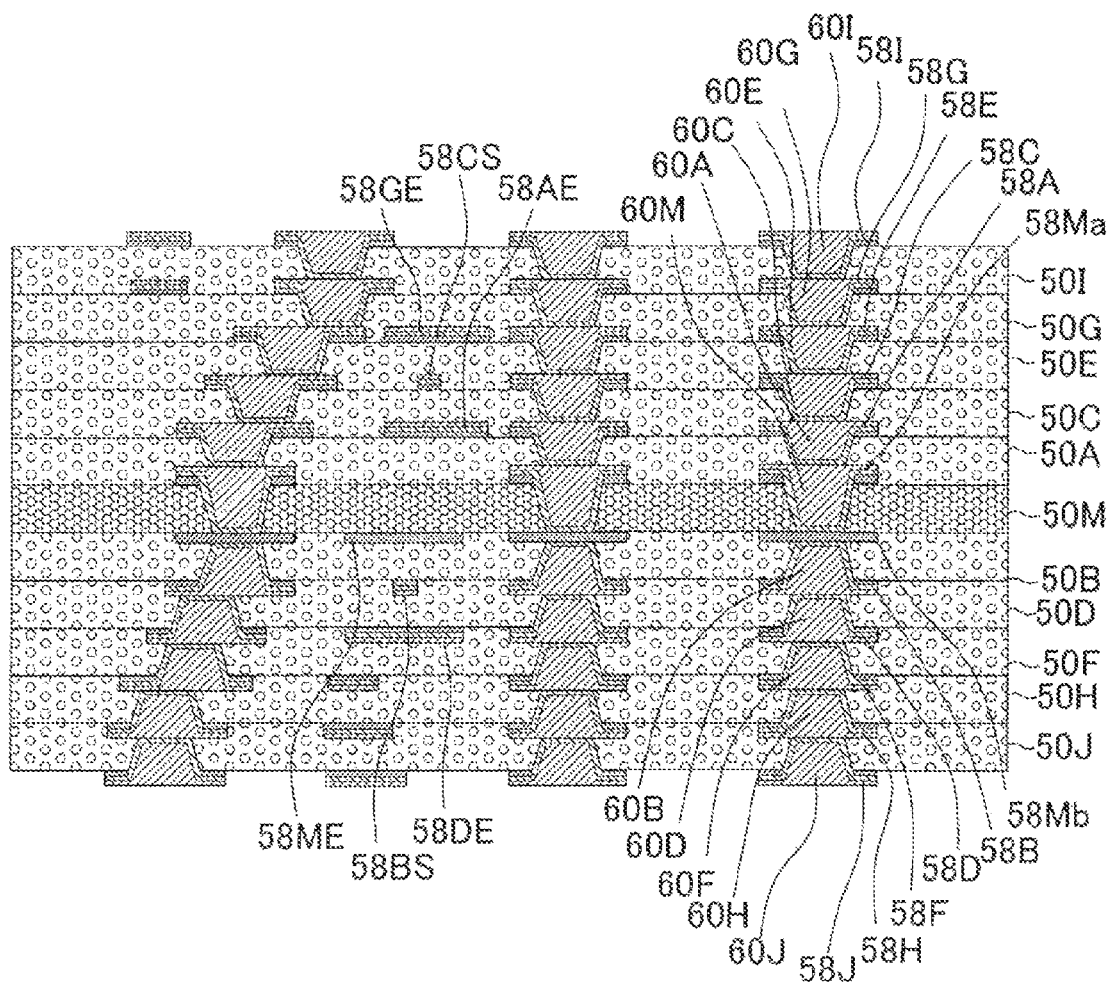
FIG. 10 is a cross-sectional view of a printed wiring board according to a second embodiment.

FIG. 10 is a cross-sectional view of a printed wiring board according to a second embodiment. In the second embodiment, core insulation layer (50M) is made of thermosetting polyphenylene ether resin, the same as in the first embodiment. Its dielectric constant at 1 GHz is set to be 4.0 or lower, and its thermal expansion coefficient at or below Tg (glass transition temperature) is set to be 85 ppm/° C. or lower, more preferably 55 ppm/° C. or lower. On the other hand, first-surface side interlayer insulation layers (50A~50I) and second-surface side interlayer insulation layers (50B~50J) are made of glass-epoxy substrate, which is formed to have a low CTE by impregnating glass cloth with epoxy resin and by further adding inorganic particles.

In the second embodiment, first-surface side interlayer insulation layers (50A~50I) and second-surface side interlayer insulation layers (50B~50J) are set to have a low CTE so that stress on core insulation layer (50M) is mitigated and the reliability of via conductors (60M) is enhanced.

First Modified Example of the Second Embodiment

Figure 11:
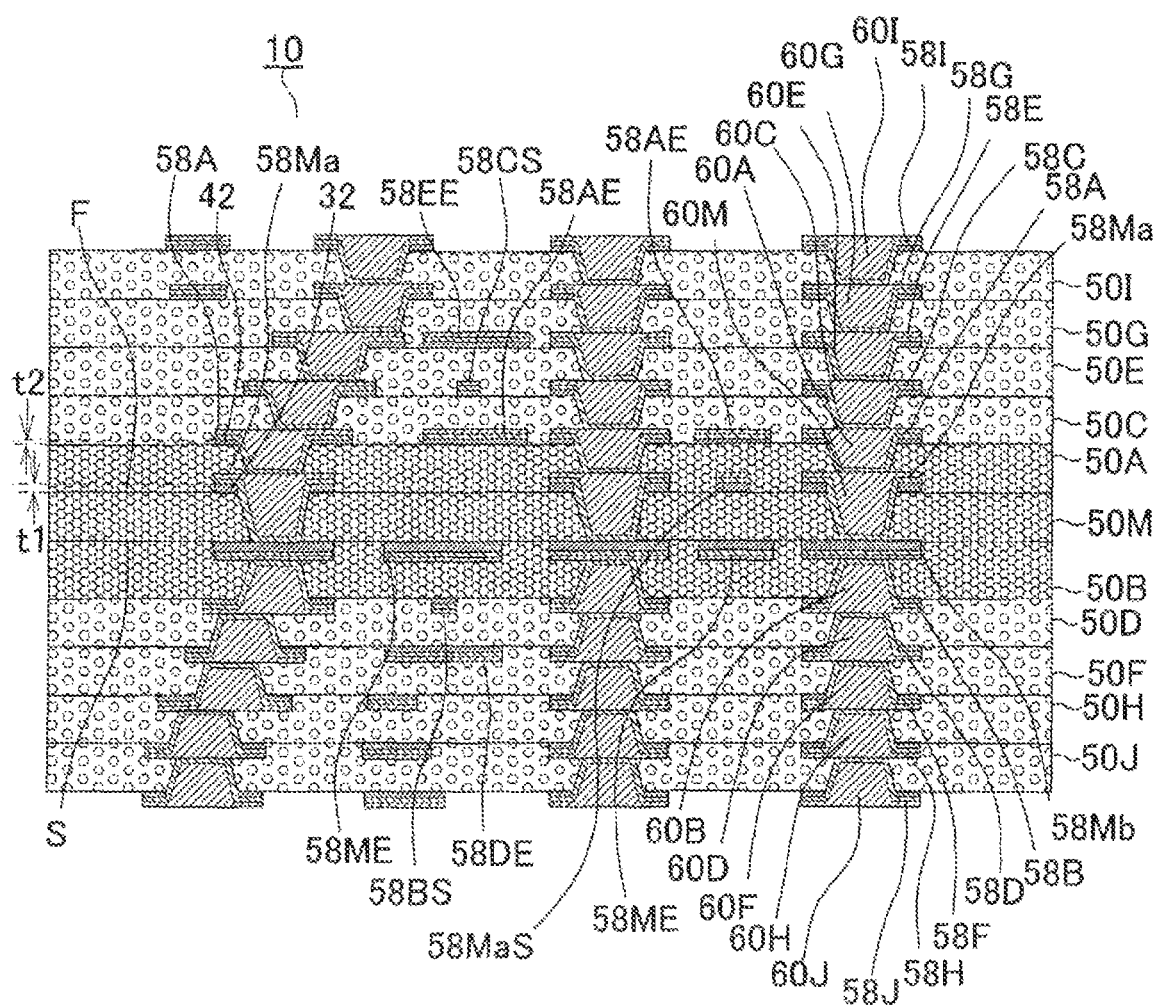
FIG. 11 is a cross-sectional view of a printed wiring board according to a first modified example of the second embodiment.

FIG. 11 is a cross-sectional view of a printed wiring board according to a modified example of the second embodiment. In the second embodiment, core insulation layer (50M) and interlayer insulation layers (50A, 50B) are made of thermosetting polyphenylene ether resin, the same as in the first embodiment. Their dielectric constant at 1 GHz is set to be 4.0 or lower, and their thermal expansion coefficient at or below Tg (glass transition temperature) is set to be 85 ppm/° C. or lower, more preferably 55 ppm/° C. or lower. On the other hand, first-surface side interlayer insulation layers (50C~50I) and second-surface side interlayer insulation layers (50D~50J) are made of glass-epoxy substrate, which is formed to have a low CTE by impregnating glass cloth with epoxy resin and by further adding inorganic particles.

Second Modified Example of the Second Embodiment

Figure 12:
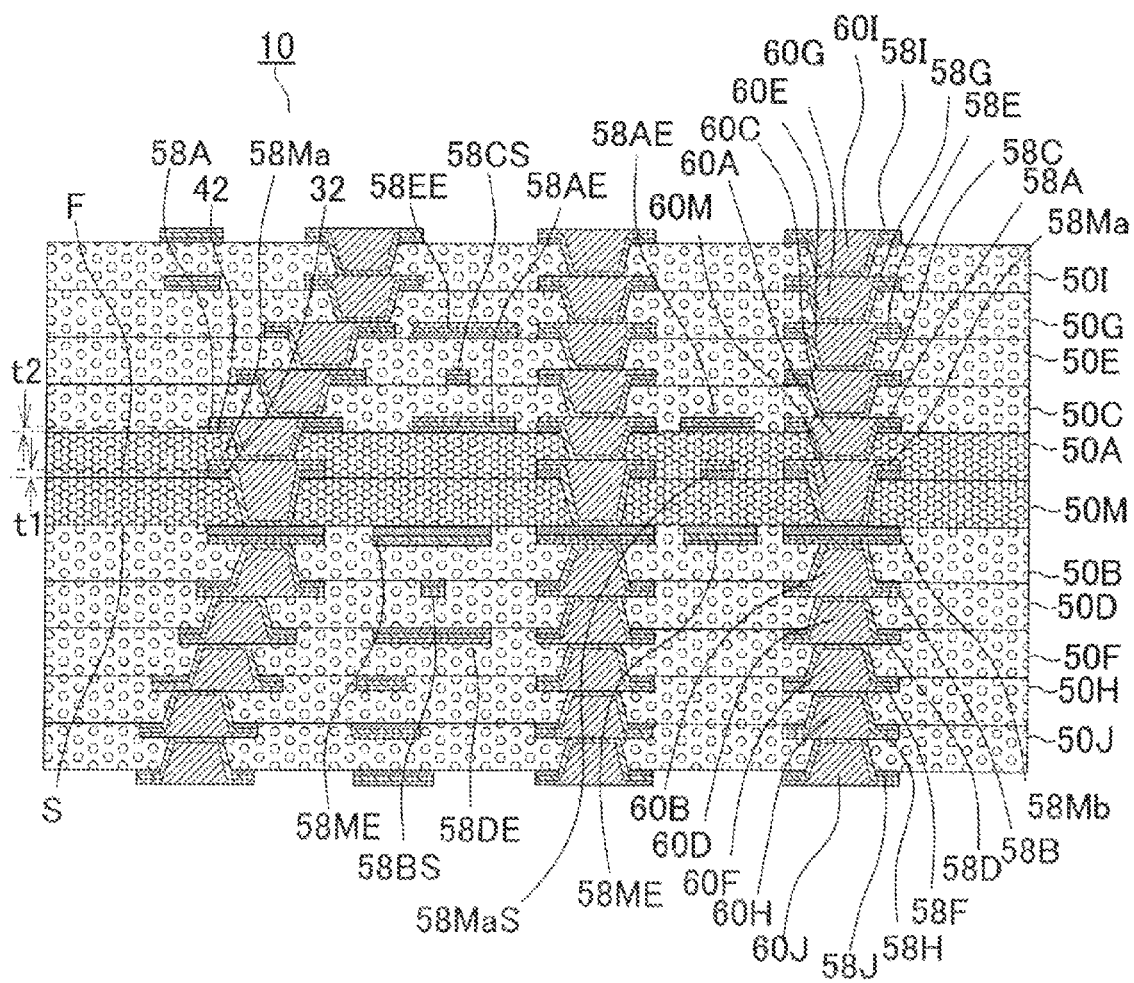
FIG. 12 is a cross-sectional view of a printed wiring board according to a second modified example of the second embodiment.

FIG. 12 is a cross-sectional view of a printed wiring board according to a second modified example of the second embodiment. In the second embodiment, core insulation layer (50M) and interlayer insulation layer (50A) are made of thermosetting polyphenylene ether resin, the same as in the first embodiment. Their dielectric constant at 1 GHz is set to be 4.0 or lower, and their thermal expansion coefficient at or below Tg (glass transition temperature) is set to be 85 ppm/° C. or lower, more preferably 55 ppm/° C. or lower. On the other hand, first-surface side interlayer insulation layers (50C~50I) and second-surface side interlayer insulation layers (50B~50J) are made of glass-epoxy substrate, which is formed to have a low CTE by impregnating glass cloth with epoxy resin and by further adding inorganic particles.

In the second embodiment, first-surface side interlayer insulation layers (50C~50I) and second-surface side interlayer insulation layers (50D~50J) are set to have a low CTE so that stress on core insulation layer (50M) is mitigated and the reliability of via conductors (60M) is enhanced. Meanwhile, core insulation layer (50M) and interlayer insulation layers (50A, 50B) are set to have a low dielectric constant, and electrical characteristics are improved in the central portion of a printed wiring board.

The thermal expansion coefficient in direction Z is high in interlayer insulation layers (50A~50J) with a low dielectric constant, and stress from such interlayer insulation layers concentrates on core insulation layer (50M) positioned in the center. Therefore, thickness (t1) of copper foil 32 of conductive circuits (58Ma, 58Mb) on both surfaces of the core insulation layer is set greater than thickness (t2) of copper foil 42 of conductive circuits on the interlayer insulation layers so that rigidity is enhanced. Accordingly, via conductors (60M) in the core insulation layer are prevented from being separated from copper foil 42 when stress is exerted, and the connection reliability of the via conductors is secured.

When insulation layers made of a curable polyphenylene ether resin composition are used, resin residue tends to remain on via bottoms when via holes are formed using a laser.

In addition, when the dielectric constant of insulation layers is set lower, their thermal expansion coefficient in direction Z becomes higher, resulting in lower connection reliability of via conductors due to thermal contraction. Especially, in a multilayer printed wiring board having a full-stack via structure, stress concentrates on via conductors formed in a central core layer where stress has no channel through which to be dissipated. Accordingly, the connection reliability of the via conductors is reduced.

Figure 13:
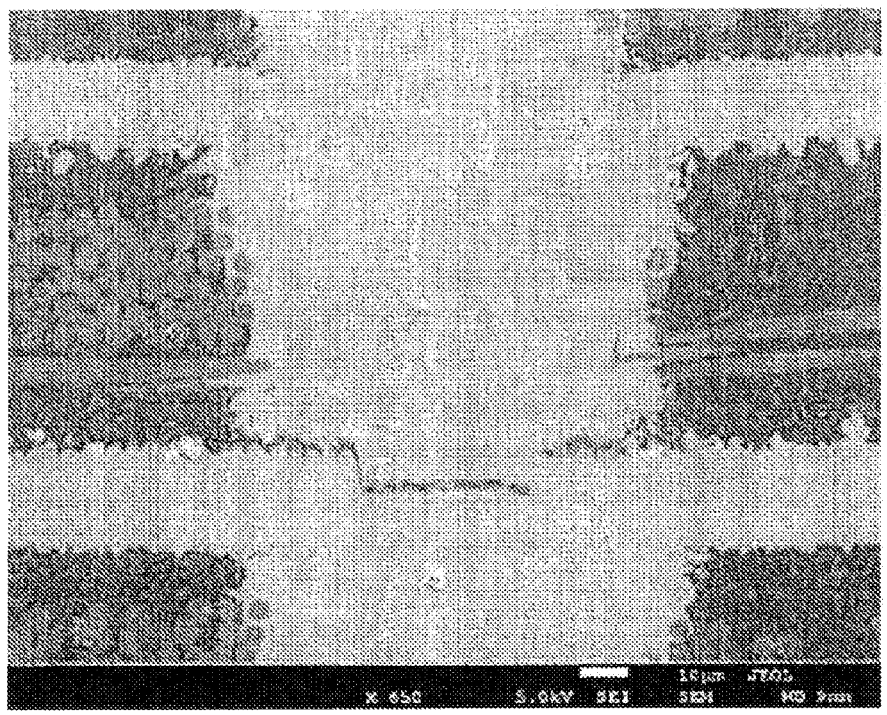
FIGS. 13(A)-13(B) are microscopic photographs of via conductors with cracking.
Figure 13:
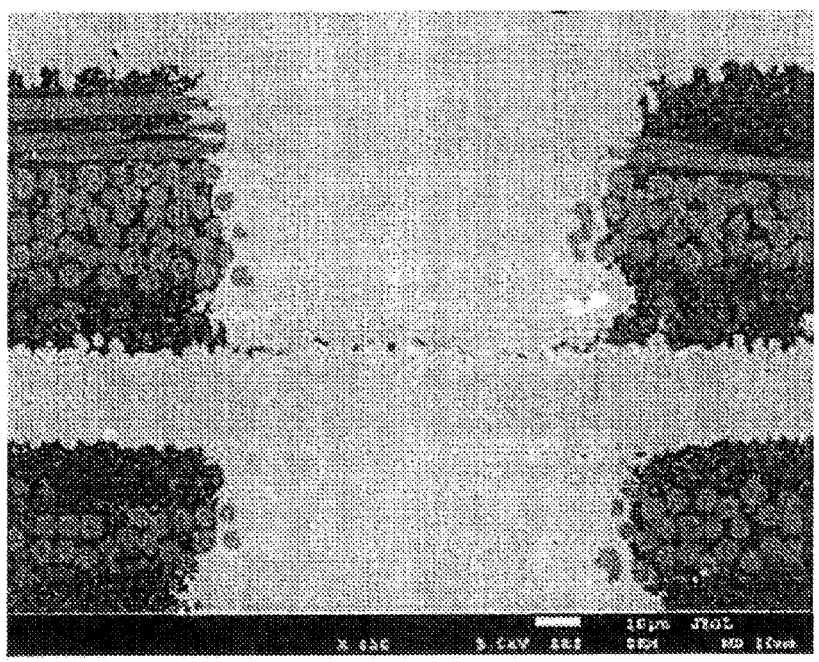

FIG. 13(A) shows a microscopic photograph of a via conductor in a core layer. Residue remains on the bottom of a via conductor and cracking is observed on a boundary surface between the plated surface and copper foil of the via conductor. In a microscopic photograph in FIG. 13(B), cracking is observed on the bottom of a via conductor due to the residue on the bottom of the via conductor.

A printed wiring board according to an embodiment of the present invention has the following: a core insulation layer with a first surface and a second surface opposite the first surface and having via conductors made by filling multiple holes with plating; first conductive layers made of copper foil laminated on the first surface and the second surface of the core insulation layer and of plated film formed on the copper foil; one or more interlayer insulation layers formed at least on either the first-surface side or the second-surface side of the core insulation layer and having via conductors made by filling multiple holes with plating; and second conductive layers made of copper foil laminated on the interlayer insulation layers and of plated film formed on the copper foil. Such a printed wiring board has the following technological features: the core insulation layer and the interlayer insulation layers each have a dielectric constant of 4.0 or lower at 1 GHz and a thermal expansion coefficient of 85 ppm/° C. or lower at or below Tg, and the thickness of the copper foil of the first conductive layers is set greater than the thickness of the copper foil of the second conductive layers.

A printed wiring board according to an embodiment of the present invention is formed by laminating multiple interlayer insulation layers on both surfaces of a core insulation layer. The core insulation layer and interlayer insulation layers each have a dielectric constant of 4.0 or lower at 1 GHz. Thus, required impedance characteristics are obtained without employing skip layers using multiple interlayer insulation layers when a stripline is structured, or without reducing wiring thickness to such a degree that would decrease production yield. On the other hand, the core insulation layer and interlayer insulation layers with a low dielectric constant have high thermal expansion coefficients in direction Z, and stress from the interlayer insulation layers concentrates on the core insulation layer positioned in the center. Therefore, the copper foil of the first conductive layers on both surfaces of the core insulation layer is set thicker to enhance rigidity so that via conductors in the core insulation layer are prevented from being separated from the copper foil when stress is exerted and the connection reliability of the via conductors is secured.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a core insulation layer comprising a resin and having a via conductor comprising a plating material filling a hole formed through the core insulation layer;
    a first conductive layer formed on a surface of the core insulation layer and comprising a copper foil laminated on the surface of the core insulation layer and a plated film formed on the copper foil;
    an interlayer insulation layer formed on the first conductive layer and comprising a resin, the interlayer insulation layer having a via conductor comprising a plating material filling a hole formed through the interlayer insulation layer; and
    a second conductive layer formed on the interlayer insulation layer and comprising a copper foil laminated on the interlayer insulation layer and a plated film formed on the copper foil of the second conductive layer,
    wherein the first conductive layer includes a conductive circuit, the second conductive layer has a conductive circuit connected to the conductive circuit in the first conductive layer through the via conductor in the interlayer insulation layer, each of the core insulation layer and the interlayer insulation layer has a dielectric constant of 4.0 or lower for a signal transmission at frequency of 1 GHz and a thermal expansion coefficient of 85 ppm/° C. or lower at or below Tg, and the copper foil of the first conductive layer has a thickness which is set greater than a thickness of the copper foil of the second conductive layer.

2. The printed wiring board according to claim 1, wherein the thickness of the copper foil of the first conductive layer is set at 5 μm or greater.

3. The printed wiring board according to claim 1, wherein the via conductor in the interlayer insulation layer is positioned such that the via conductor in the interlayer insulation layer is stacked on the via conductor in the core insulation layer.

4. The printed wiring board according to claim 1, wherein at least one of the first conductive layer and the second conductive layer includes a stripline.

5. The printed wiring board according to claim 1, wherein the interlayer insulation layer is formed in a plurality, and the plurality of interlayer insulation layers includes a same resin.

6. The printed wiring board according to claim 1, wherein the resin of the core insulation layer is a polyphenylene ether resin.

7. The printed wiring board according to claim 6, wherein the dielectric constant of the core insulation layer is set lower than the dielectric constant of the interlayer insulation layer.

8. The printed wiring board according to claim 1, wherein the resin of the core insulation layer is a polyphenylene ether resin, the resin of the interlayer insulation layer is a polyphenylene ether resin, the interlayer insulation layer includes an inorganic filler, and the thermal expansion coefficient of the interlayer insulation layer is 55 ppm/° C. or lower.

9. The printed wiring board according to claim 1, wherein the interlayer insulation layer is formed in a plurality, each of the plurality of interlayer insulation layers includes an inorganic filler, and each of the plurality of interlayer insulation layers has the thermal expansion coefficient of 55 ppm/° C. or lower.

10. The printed wiring board according to claim 1, wherein the interlayer insulating layer comprises glass cloth.

11. A printed wiring board, comprising:
    a core insulation layer comprising a resin and having a via conductor comprising a plating material filling a hole formed through the core insulation layer;
    a first laminated structure formed on a first surface of the core insulation layer and comprising a first conductive layer, an interlayer insulation layer and a second conductive layer; and
    a second laminated structure formed on a second surface of the core insulation layer on an opposite side of the first surface of the core insulation layer and comprising a first conductive layer, an interlayer insulation layer and a second conductive layer, wherein the first conductive layer of the first laminated structure is formed on the first surface of the core insulation layer and comprises a copper foil laminated on the first surface of the core insulation layer and a plated film formed on the copper foil, the interlayer insulation layer of the first laminated structure is formed on the first conductive layer of the first laminated structure, comprises a resin and has a via conductor comprising a plating material filling a hole formed through the interlayer insulation layer of the first laminated structure, the second conductive layer of the first laminated structure is formed on the interlayer insulation layer of the first laminated structure and comprises a copper foil laminated on the interlayer insulation layer of the first laminated structure and a plated film formed on the copper foil of the second conductive layer of the first laminated structure, the first conductive layer of the second laminated structure is formed on the second surface of the core insulation layer and comprises a copper foil laminated on the second surface of the core insulation layer and a plated film formed on the copper foil of the first conductive layer of the second laminated structure, the interlayer insulation layer of the second laminated structure is formed on the first conductive layer of the second laminated structure, comprises a resin and has a via conductor comprising a plating material filling a hole formed through the interlayer insulation layer of the second laminated structure, the second conductive layer of the second structure is formed on the interlayer insulation layer of the second laminated structure and comprises a copper foil laminated on the interlayer insulation layer of the second laminated structure and a plated film formed on the copper foil of the second conductive layer of the second laminated structure, each of the first conductive layers of the first and second laminated structures includes a conductive circuit, each of the second conductive layers of the first and second laminated structures has a conductive circuit connected to the conductive circuit in a respective one of the first conductive layers of the first and second laminated structures through the via conductor in a respective one of the interlayer insulation layers of the first and second laminated structures, each of the core insulation layer and the interlayer insulation layers has a dielectric constant of 4.0 or lower at a signal frequency of 1 GHz and a thermal expansion coefficient of 85 ppm/° C. or lower at or below Tg, and the copper foil of the first conductive layer in each of the first and second laminated structures has a thickness which is set greater than a thickness of the copper foil of the second conductive layer in each of the first and second laminated structures.

12. The printed wiring board according to claim 11, wherein the thickness of the copper foil of each of the first conductive layers is set at 5 μm or greater.

13. The printed wiring board according to claim 11, wherein the via conductor in the interlayer insulation layer of the first laminated structure is positioned such that the via conductor in the interlayer insulation layer is stacked on the via conductor in the core insulation layer, and the via conductor in the interlayer insulation layer of the second laminated structure is positioned such that the via conductor in the interlayer insulation layer is stacked on the via conductor in the core insulation layer.

14. The printed wiring board according to claim 11, wherein at least one of the first conductive layer and the second conductive layer in the first laminated structure includes a stripline, and at least one of the first conductive layer and the second conductive layer in the second laminated structure includes a stripline.

15. The printed wiring board according to claim 11, wherein the interlayer insulation layer in the first laminated structure and the interlayer insulation layer in the second laminated structure are positioned on same tiers counted from the core insulation layer and are made of a same material.

16. The printed wiring board according to claim 11, wherein the resin of the core insulation layer is a polyphenylene ether resin, and the dielectric constant of the core insulation layer is set lower than the dielectric constants of the interlayer insulation layers in the first and second laminated structures.

17. The printed wiring board according to claim 11, wherein the resin of the core insulation layer is a polyphenylene ether resin, the resin of the interlayer insulation layer in the first laminated structure is a polyphenylene ether resin, and the resin of the interlayer insulation layer in the second laminated structure is a polyphenylene ether resin.

18. The printed wiring board according to claim 17, wherein the interlayer insulation layer in the first laminated structure includes an inorganic filler, the thermal expansion coefficient of the interlayer insulation layer in the first laminated structure is 55 ppm/° C. or lower, the interlayer insulation layer in the second laminated structure includes an inorganic filler, and the thermal expansion coefficient of the interlayer insulation layer in the second laminated structure is 55 ppm/° C. or lower.

19. The printed wiring board according to claim 11, wherein the first laminated structure includes a plurality of interlayer insulation layers including the interlayer insulation layer formed on the first conductive layer of the first laminated structure, and the second laminated structure includes a plurality of interlayer insulation layers including the interlayer insulation layer formed on the first conductive layer of the second laminated structure.

20. The printed wiring board according to claim 11, wherein the interlayer insulating layer comprises glass cloth.

* * * * *